United States Patent
So et al.

(10) Patent No.: US 11,842,012 B2
(45) Date of Patent: Dec. 12, 2023

(54) TOUCH SENSING METHOD AND DISPLAY DEVICE

(71) Applicant: Samsung Display Co., LTD., Yongin-si (KR)

(72) Inventors: Yong Sub So, Yongin-si (KR); Ji Hoon Kim, Yongin-si (KR); Sang Hun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/887,318

(22) Filed: Aug. 12, 2022

(65) Prior Publication Data

US 2023/0094855 A1   Mar. 30, 2023

(30) Foreign Application Priority Data

Sep. 30, 2021   (KR) .......................... 10-2021-0130179

(51) Int. Cl.
 G06F 3/041   (2006.01)
 G06F 3/044   (2006.01)

(52) U.S. Cl.
 CPC ........ G06F 3/04182 (2019.05); G06F 3/0412 (2013.01); G06F 3/0443 (2019.05); G06F 3/0446 (2019.05)

(58) Field of Classification Search
 None
 See application file for complete search history.

(56) References Cited

U.S. PATENT DOCUMENTS

| | | | |
|---|---|---|---|
| 9,996,207 B2 | 6/2018 | Lee et al. | |
| 2013/0002600 A1* | 1/2013 | McCracken | G06F 3/04186 345/173 |
| 2014/0240251 A1* | 8/2014 | Takano | G06F 3/04182 345/173 |
| 2014/0313148 A1* | 10/2014 | Oh | G06F 3/04886 345/173 |
| 2015/0179219 A1* | 6/2015 | Gao | G08B 13/19 386/278 |
| 2018/0331160 A1* | 11/2018 | Beak | G06F 3/0446 |
| 2019/0310755 A1* | 10/2019 | Sasaki | G06F 3/044 |
| 2019/0384475 A1* | 12/2019 | Kim | G06F 3/044 |
| 2021/0149540 A1* | 5/2021 | Shikata | G09G 3/20 |

FOREIGN PATENT DOCUMENTS

| | | |
|---|---|---|
| KR | 10-1346945 B1 | 1/2014 |
| KR | 10-2018-0013585 A | 2/2018 |
| KR | 10-1913817 B1 | 10/2018 |

\* cited by examiner

*Primary Examiner* — Duane N Taylor, Jr.
(74) *Attorney, Agent, or Firm* — Lewis Roca Rothgerber Christie LLP

(57) ABSTRACT

A display device includes: a display panel; a sensor unit on the display panel; a touch driver including a signal processor configured to output a final touch point coordinate using a touch sensing signal received from the sensor unit; and an application processor configured to provide filter size information to the touch driver, wherein the signal processor includes a jitter remover configured to receive a current touch point coordinate from a coordinate calculator and to output the final touch point coordinate from which a jitter component is removed by filtering with a jitter filter, and wherein the jitter remover includes a filter size determiner configured to vary a range of the jitter filter in response to the filter size information.

21 Claims, 11 Drawing Sheets

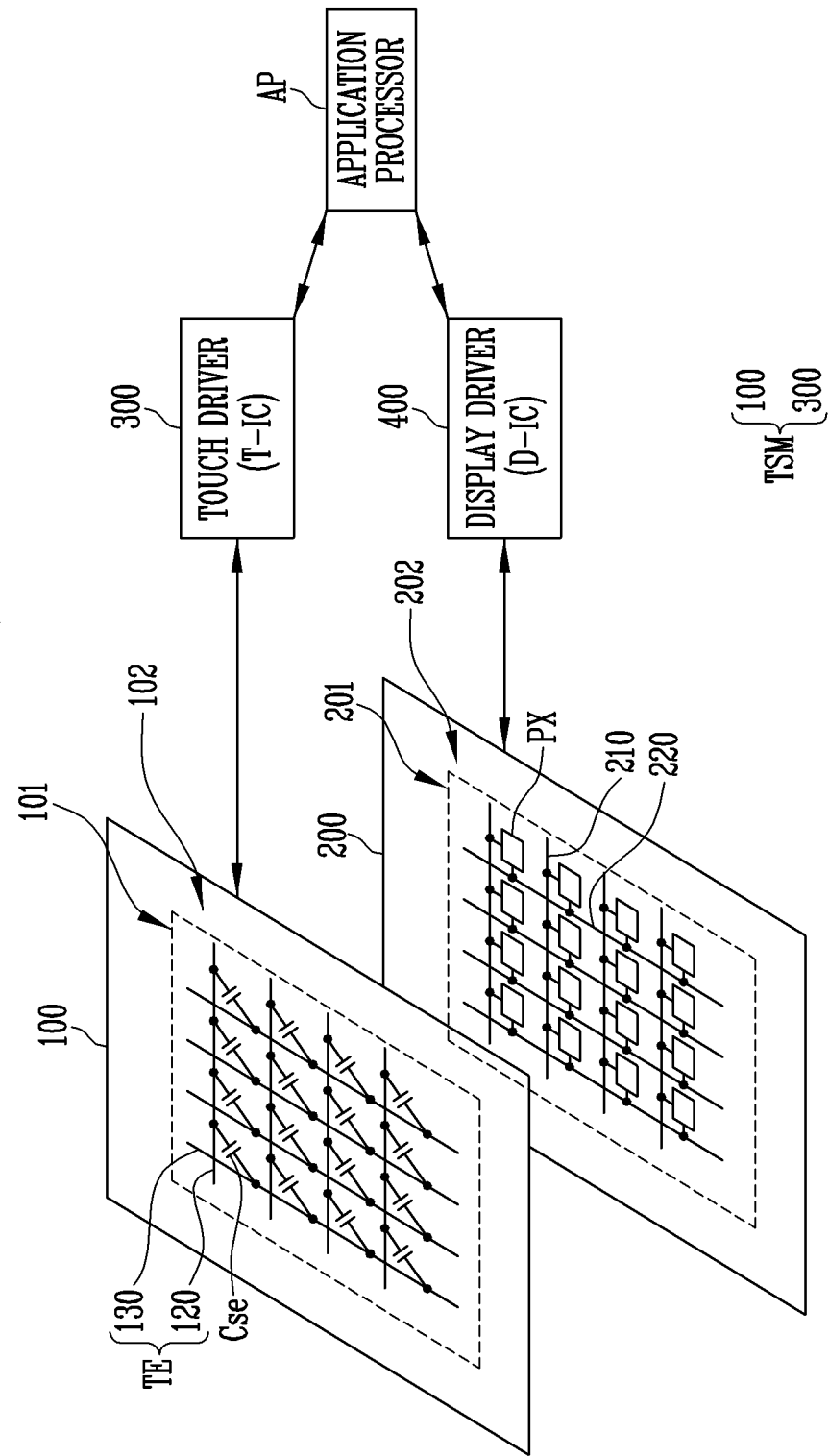

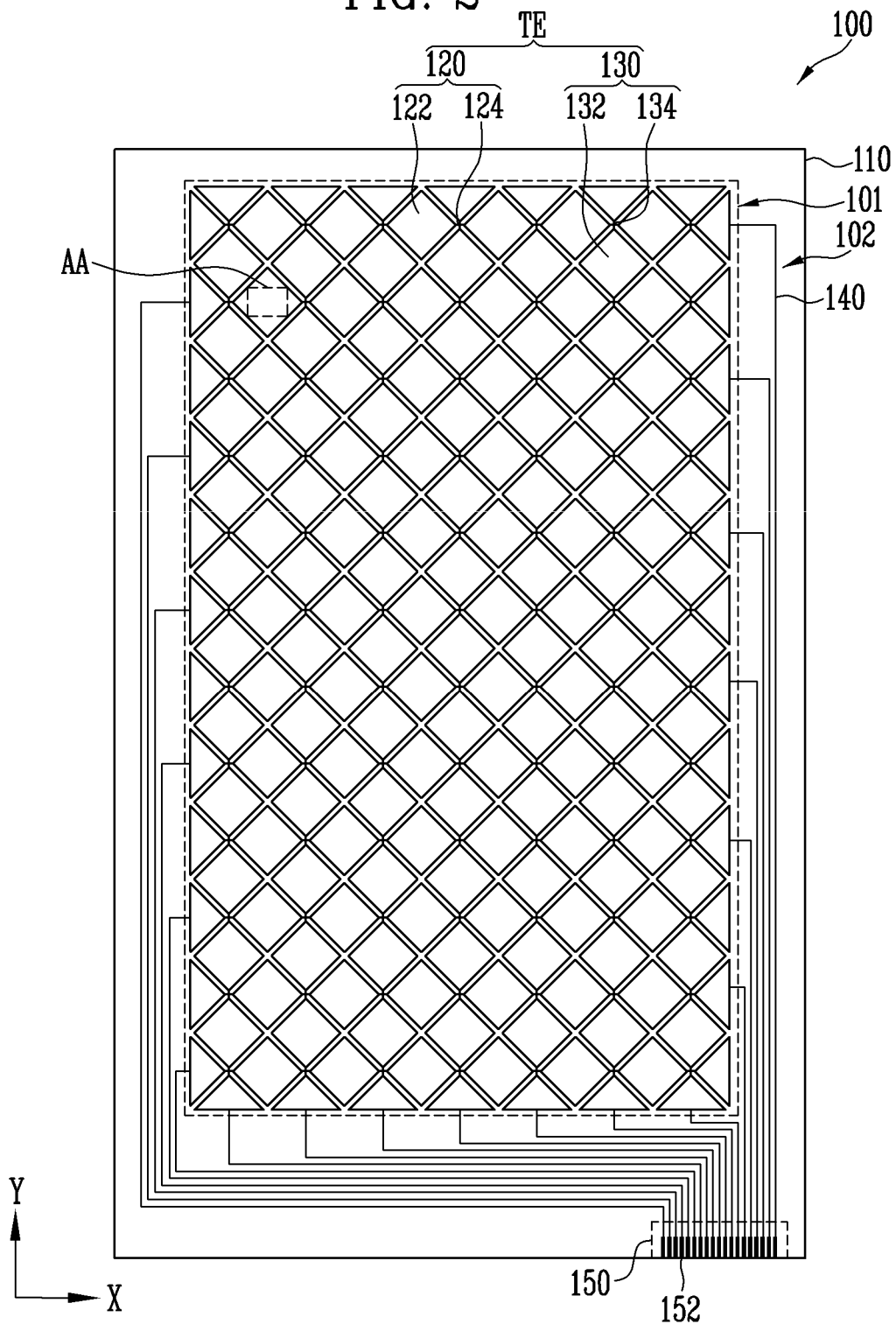

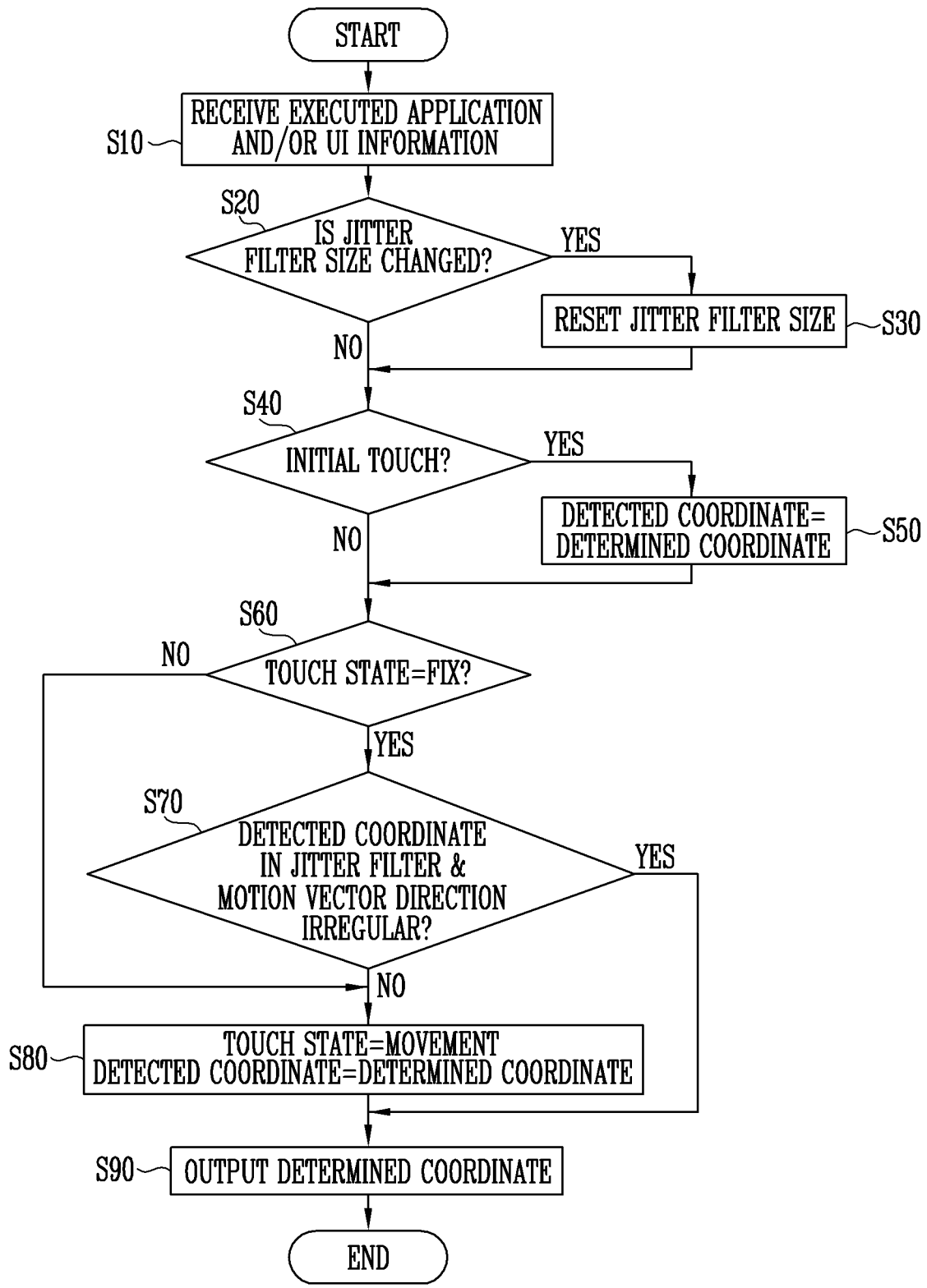

TOUCH SENSING METHOD AND DISPLAY DEVICE

CROSS-REFERENCE TO RELATED APPLICATION

The present application claims priority to and the benefit of Korean Patent Application No. 10-2021-0130179, filed on Sep. 30, 2021, the entire disclosure of which is incorporated by reference herein.

BACKGROUND

1. Field

Aspects of some embodiments of the present disclosure relate to a touch sensing method and a display device.

2. Description of the Related Art

An electronic device such as a smart phone, a digital camera, a notebook computer, a navigation system, and a smart TV displaying images to a user includes display devices for displaying the images. A display device generally includes a display panel that generates and displays images, in addition to various input devices.

A touch sensor for recognizing a touch input may be applied to a display device centered on a smart phone or a tablet PC. The touch sensor may, for example, replace a keypad or the like which is the existing physical input device, due to convenience of a touch method.

A touch sensor may detect a touch area using a read out signal, detect a peak having a relatively large data value in the touch area as a touch point, and calculate and outputs a coordinate of the detected touch point. However, when the touch sensor is affected by external noise, a jitter phenomenon in which the touch point is randomly detected in the touch area may occur. The jitter phenomenon may be removed by filtering the touch point coordinate to reduce the jitter phenomenon.

The above information disclosed in this Background section is only for enhancement of understanding of the background and therefore the information discussed in this Background section does not necessarily constitute prior art.

SUMMARY

Aspects of some embodiments of the present disclosure relate to a touch sensing method and a display device, and for example, to a touch sensing method and a display device capable of varying a range of a jitter filter that removes a jitter component.

An object to be solved by the disclosure is to provide a touch sensing method and a display device capable of varying a range of a jitter filter in response to an application and/or a user interface used by a user.

Characteristics of embodiments according to the present disclosure are not limited to the above-described characteristics, and other technical characteristics which are not described will be more clearly understood by those skilled in the art from the following description.

According to some embodiments of the present disclosure, a display device includes a display panel, a sensor unit on the display panel, a touch driver including a signal processor for outputting a final touch point coordinate using a touch sensing signal received from the sensor unit, and an application processor configured to provide filter size information to the touch driver.

According to some embodiments, the signal processor may include a jitter removal unit that receives a current touch point coordinate from a coordinate calculator and outputs the final touch point coordinate from which a jitter component is removed by filtering with a jitter filter, and the jitter removal unit may include a filter size determiner that varies a range of the jitter filter in response to the filter size information.

According to some embodiments, the signal processor may further include a touch determiner that detects touch areas using the touch sensing signal, and the coordinate calculator may detect a touch point coordinate representing each of the touch areas.

According to some embodiments, the filter size information may include the range of the jitter filter preset for each user interface.

According to some embodiments, the range of the jitter filter may have a first size when the user interface performs the same function on a touch input within a first range, and may have a second size less than the first size when the user interface performs the same function on a touch input within a second range narrower than the first range.

According to some embodiments, a shape of the jitter filter may be any one of a circle, an ellipse, and a quadrangle.

According to some embodiments, the jitter removal unit may calculate a motion vector of the current touch point coordinate based on a previous touch point coordinate.

According to some embodiments, the jitter removal unit may output the current point coordinate as the final touch point coordinate when the current point coordinate is an initial touch.

According to some embodiments, in response to a size of the motion vector being less than the range of the jitter filter and a direction of the motion vector being irregular during a preset frame, the jitter removal unit may determine the current touch point coordinate as the jitter component of a touch fix state, and output the previous touch point coordinate as the final touch point coordinate.

According to some embodiments, in response to a size of the motion vector being greater than the range of the jitter filter and a direction of the motion vector being constant during a preset frame, the jitter removal unit may determine a touch movement state and output the current touch point coordinate as the final touch point coordinate.

According to some embodiments, the jitter removal unit may output the current touch point coordinate as the final touch point coordinate without determining the jitter component when a previous touch state is the touch movement state.

According to some embodiments, in the display panel, a base substrate, an element layer, and a thin film encapsulation layer may be sequentially stacked, and the sensor unit may be formed on the thin film encapsulation layer.

According to some embodiments of the present disclosure, a touch sensing method in a display device including a display panel that displays an execution screen of an application, and a sensor unit on the display panel includes receiving a touch sensing signal from the sensor unit, detecting touch areas using the touch sensing signal, detecting a touch point coordinate representing each of the touch areas, removing a jitter component by filtering a current touch point coordinate detected in detecting the touch point coordinate with a jitter filter, and outputting a final touch point coordinate from which the jitter component is removed.

According to some embodiments, removing the jitter component further includes receiving filter size information from an application processor and varying a size of the jitter filter in response to the filter size information.

According to some embodiments, the filter size information may include a range of the jitter filter preset for each user interface.

According to some embodiments, the range of the jitter filter may have a first size when the user interface performs the same function on a touch input within a first range, and may have a second size less than the first size when the user interface performs the same function on a touch input within a second range narrower than the first range.

According to some embodiments, a shape of the jitter filter may be any one of a circle, an ellipse, and a quadrangle.

According to some embodiments, removing the jitter component may include calculating a motion vector of the current touch point coordinate based on a previous touch point coordinate.

According to some embodiments, removing the jitter component may include outputting the current point coordinate as the final touch point coordinate when the current point coordinate is an initial touch.

According to some embodiments, removing the jitter component may include determining the current touch point coordinate as the jitter component of a touch fix state, and outputting the previous touch point coordinate as the final touch point coordinate, when a size of the motion vector is less than the range of the jitter filter and a direction of the motion vector is irregular during a preset frame.

According to some embodiments, removing the jitter component may include determining as a touch movement state and outputting the current touch point coordinate as the final touch point coordinate, when a size of the motion vector is greater than the range of the jitter filter and a direction of the motion vector is constant during a preset frame.

According to some embodiments, removing the jitter component may include outputting the current touch point coordinate as the final touch point coordinate without determining the jitter component when a previous touch state is the touch movement state.

According to some embodiments, in the display panel, a base substrate, an element layer, and a thin film encapsulation layer may be sequentially stacked, and the sensor unit may be formed on the thin film encapsulation layer.

According to some embodiments, the display device may vary the range of the jitter filter in response to an application and/or a user interface used by a user.

Aspects and characteristics of embodiments according to the present disclosure are not limited by the contents illustrated above, and more various characteristics are included in the present specification.

BRIEF DESCRIPTION OF THE DRAWINGS

The above and other features of embodiments according to the present disclosure will become more apparent by describing in further detail aspects of some embodiments thereof with reference to the accompanying drawings, in which:

FIG. 1A schematically illustrates a display device according to some embodiments of the present disclosure;

FIG. 2 illustrates a sensor unit of a touch sensor according to some embodiments of the present disclosure;

FIG. 9 is a flowchart illustrating a jitter removal method in a touch sensing method according to some embodiments of the present disclosure.

DETAILED DESCRIPTION

Figure 1B:
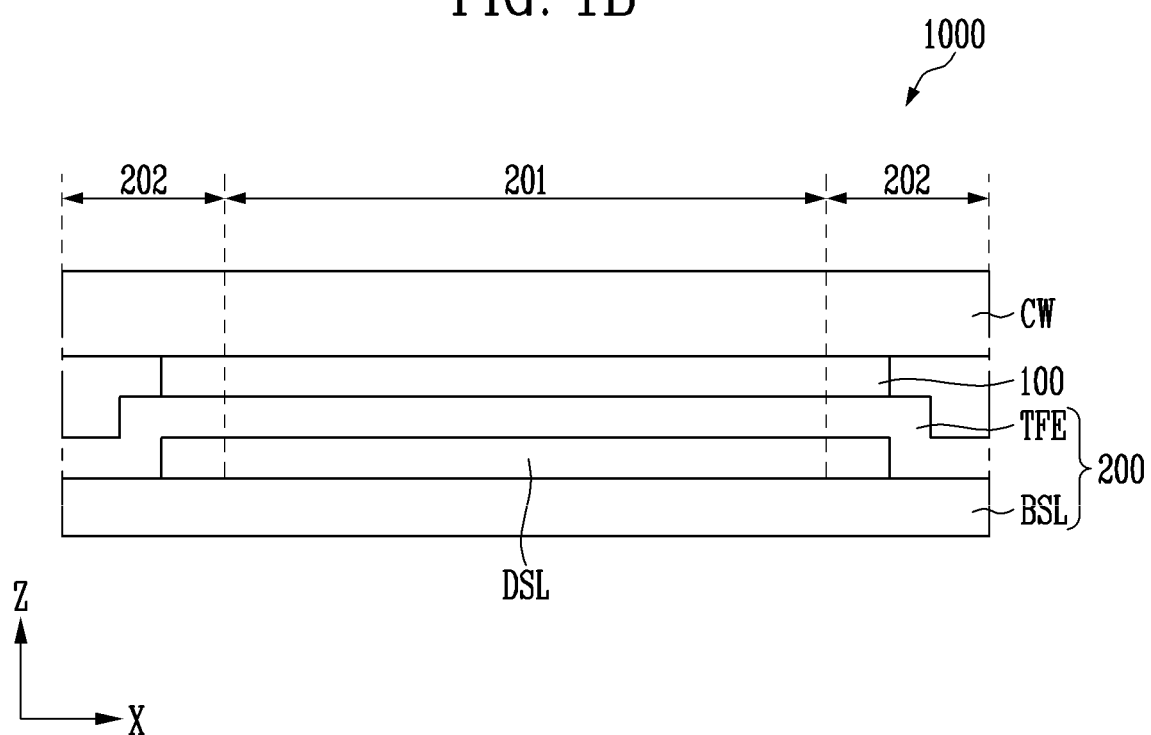
FIG. 1B is a schematic partial cross-sectional view of the display device shown in FIG. 1A according to some embodiments of the present disclosure.

The characteristics and features of embodiments according to the present disclosure and a method of achieving them will become more apparent with reference to the embodiments described in more detail below together with the accompanying drawings. However, embodiments according to the present disclosure are not limited to the embodiments disclosed below, and may be implemented in various different forms. The present embodiments are provided so that the disclosure will be thorough and complete and those skilled in the art to which the disclosure pertains can fully understand the scope of the disclosure. The disclosure is only defined by the scope of the claims.

A case in which an element or a layer is cony of another element or layer includes both of a case in which another layer or another element is interposed directly on the other element and a case in which another layer or another element is interposed between the elements.

Although the first, second, third, fourth, and the like are used to describe various components, these components are not limited by these terms, of course. These terms are only used to distinguish one component from another component. Therefore, a first component described below may be any one of a second component, a third component, and a fourth component within the technical spirit of the disclosure.

Embodiments described herein will be described with reference to a plan view and a cross-sectional view, which are ideal schematic views of the disclosure. Therefore, a shape of an illustrative drawing may be modified due to manufacturing technology and/or tolerance. Accordingly, the embodiments of the disclosure are not limited to a shown specific form, but also include a change of a shape generated according to a manufacturing process. Therefore, areas illustrated in the drawing have schematic properties, and a shape of the illustrated areas in the drawing are intended to illustrate a specific shape of an area of an element, and not to limit the scope of the disclosure.

Hereinafter, embodiments will be described with reference to the accompanying drawings.

Figure 3:
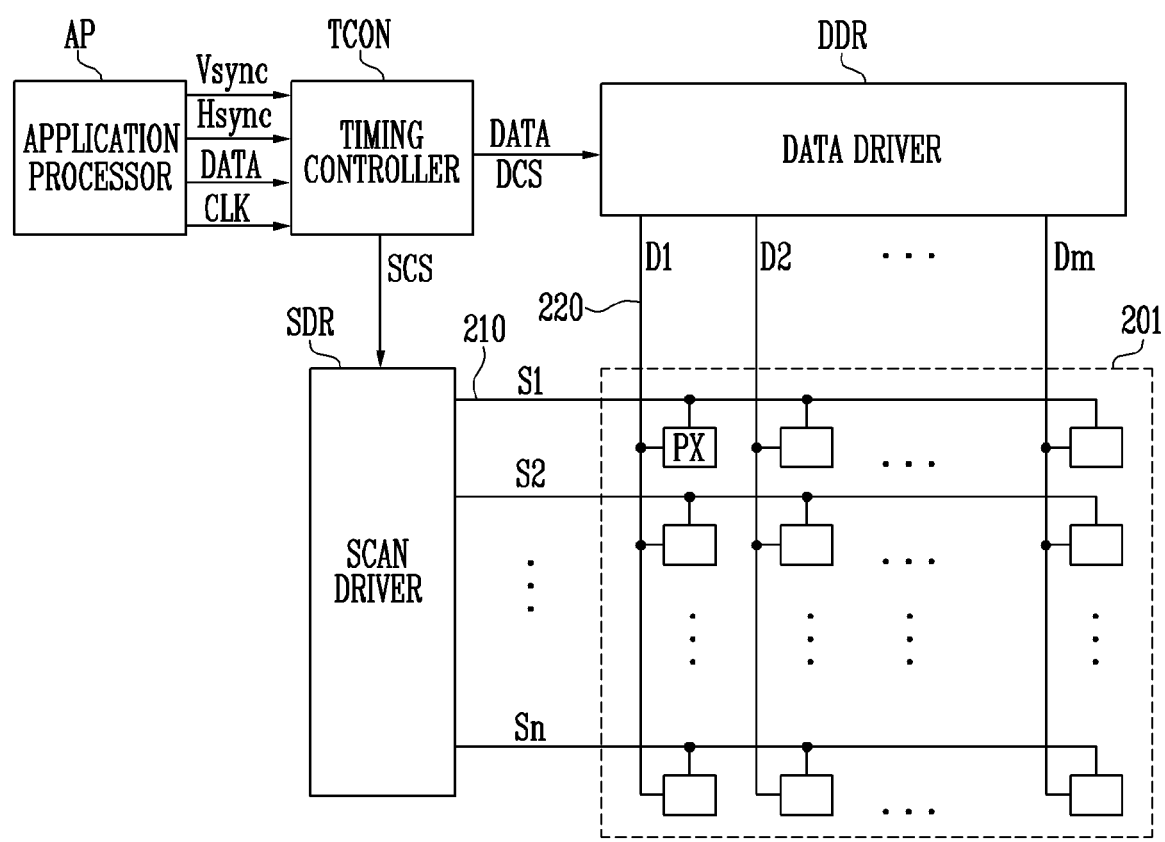
FIG. 3 is a block diagram illustrating a display panel and a display driver according to some embodiments of the present disclosure.
Figure 4A:
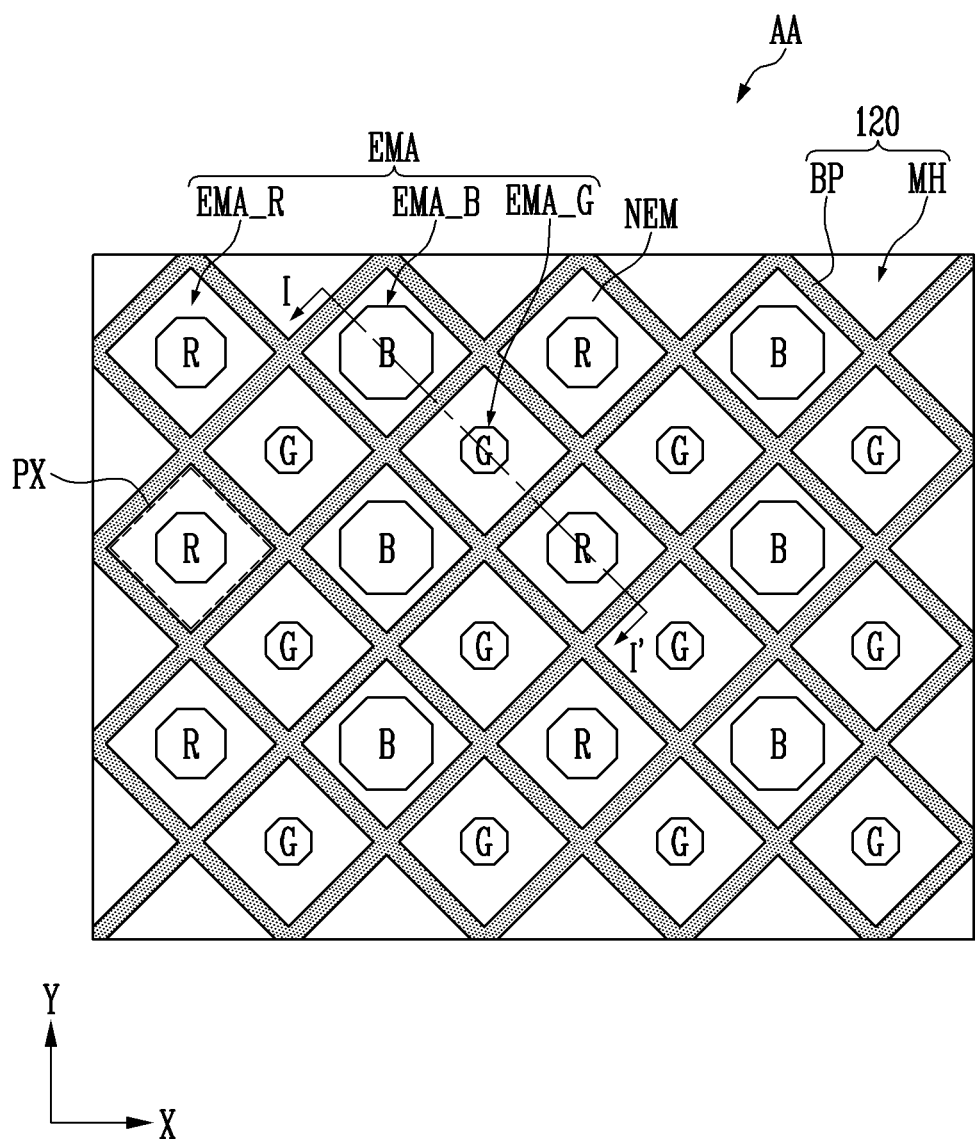
FIG. 4A is an enlarged view of an area AA of FIG. 2 schematically illustrating an arrangement relationship of a pixel of a display panel and a touch sensor unit according to some embodiments of the present disclosure.
Figure 4B:
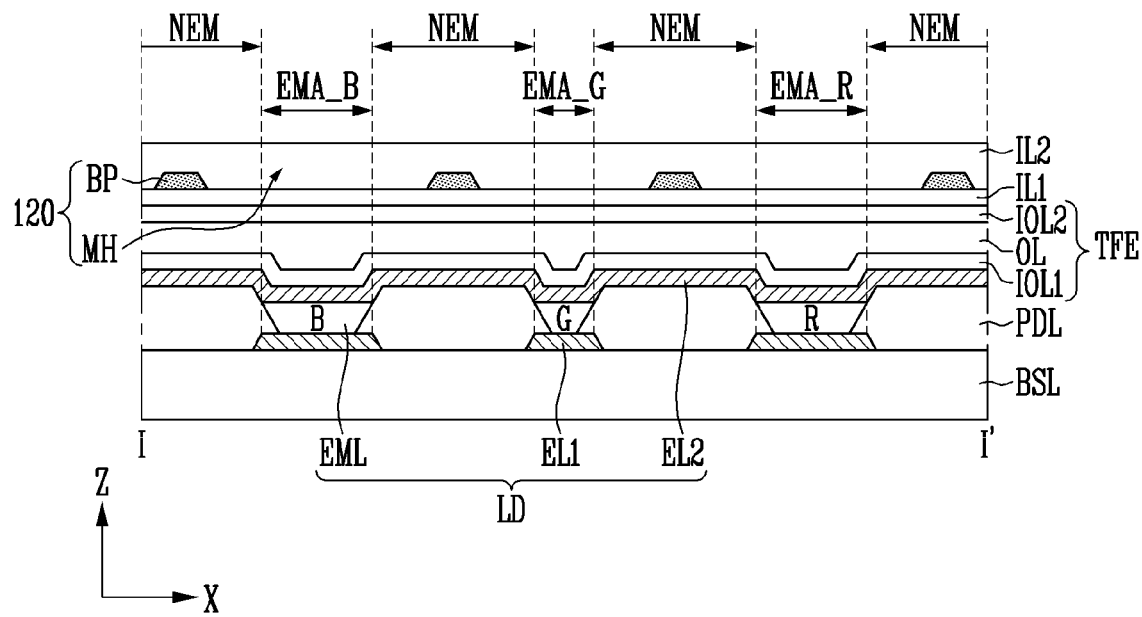
FIG. 4B is a cross-sectional view taken along a line I-I' of FIG. 4A according to some embodiments of the present disclosure.

FIG. 1A schematically illustrates a display device according to some embodiments of the present disclosure. FIG. 1B is a schematic partial cross-sectional view of the display device shown in FIG. 1A. FIG. 2 illustrates a sensor unit of a touch sensor according to some embodiments of the present disclosure. FIG. 3 is a block diagram illustrating a display panel and a display driver according to some embodiments of the present disclosure. FIG. 4A is an enlarged view of an area AA of FIG. 2 schematically illustrating an arrangement relationship of a pixel of a display panel and a touch sensor unit according to some embodiments. FIG. 4B is a cross-sectional view taken along a line I-I' of FIG. 4A.

Referring to FIG. 1A, the display device 1000 according to some embodiments of the present disclosure includes a sensor unit (or sensor) 100, a display panel 200, a touch driver 300, and a display driver 400. The sensor unit 100 and the touch driver 300 configure or collectively constitute a touch sensor TSM.

According to some embodiments of the present disclosure, the display device 1000 may be applied to an electronic device or the like such as a tablet, a car navigation system, a game machine, a smart phone, and a smart watch.

Meanwhile, in the embodiments described with respect to FIG. 1A, the sensor unit 100 and the display panel 200 are separately from each other, but embodiments according to the present disclosure are not limited thereto. For example, the sensor unit 100 and the display panel 200 may be integrally manufactured (e.g., may be formed as an integrated unit or component).

According to some embodiments, the sensor unit 100 may be provided or located on at least one surface of the display panel 200. For example, the sensor unit 100 may be located on one surface (for example, an upper surface) of the display panel 200 in a direction in which an image is emitted. According to some embodiments, the sensor unit 100 may be formed directly on at least one surface of both surfaces of the display panel 200, or may be formed inside the display panel 200. For example, the sensor unit 100 may be directly formed on an outer surface of an upper substrate or a lower substrate (that is, an upper surface of the upper substrate or a lower surface of the lower substrate) of the display panel 200, or may be directly formed on an inner surface of the upper substrate or the lower substrate (that is, a lower surface of the upper substrate or an upper surface of the lower substrate).

The sensor unit 100 may include a touch active area 101 capable of sensing a touch input and a touch inactive area 102 located outside the touch active area 101. According to some embodiments, the touch active area 101 may be arranged to correspond to a display area 201 of the display panel 200.

According to some embodiments, the sensor unit 100 may be arranged so that at least one area overlaps the display panel 200. For example, at least one area of the sensor unit 100, for example, the touch active area 101 may be arranged on one area of the display panel 200, for example, the display area 201. According to some embodiments, at least one touch electrode TE for detecting the touch input, for example, a first touch electrode 120 and a second touch electrode 130 may be located in the touch active area 101.

That is, the first touch electrode 120 and the second touch electrode 130 may be provided on the display area 201 of the display panel 200.

In the touch inactive area 102, lines for connecting the touch electrode TE provided in the touch active area 101, for example, the first and second touch electrodes 120 and 130 to the touch driver 300 and the like may be arranged. According to some embodiments, the touch inactive area 102 may be arranged to correspond to a non-display area 202 of the display panel 200.

For example, the sensor unit 100 may include at least one first touch electrode 120 and at least one second touch electrode 130 provided in the touch active area 101. For example, the sensor unit 100 may include a plurality of first touch electrodes 120 and a plurality of second touch electrodes 130 crossing the first touch electrodes 120. According to some embodiments, the first touch electrodes 120 may extend along a first direction, and the second touch electrodes 130 may extend along a second direction crossing the first direction while being insulated from the first touch electrodes 120 by an insulating layer. A capacitance Cse is formed between the first touch electrodes 120 and the second touch electrodes 130, for example, at intersections thereof. The capacitance Cse is changed when a touch input is generated at or around a corresponding point. Therefore, the touch input may be sensed by detecting a change of the capacitance Cse.

A shape, a size, an arrangement direction and/or the like of the first touch electrodes 120 and the second touch electrodes 130 are/is not particularly limited. As a non-limiting example related to this, the first touch electrodes 120 and the second touch electrodes 130 may be configured as shown in FIG. 2.

Referring to FIG. 2, the sensor unit 100 may include a base substrate 110 in which the touch active area 101 and the touch inactive area 102 are defined, the first touch electrodes 120 and the second touch electrodes 130 provided in the touch active area 101 on the based substrate 110, and lines 140 and a pad unit 150 provided in the touch inactive area 102 on the base substrate 110.

The base substrate 110 may be a substrate serving as a base member for the sensor unit 100, and may be a rigid substrate or a flexible substrate. For example, the base substrate 110 may be a rigid substrate formed of glass or tempered glass, or a flexible substrate formed of a thin film of a flexible plastic material. Meanwhile, according to some embodiments, the base substrate 110 may be omitted. For example, when the first and second electrodes 120 and 130 are directly formed on at least one substrate configuring the display panel 200, the base substrate 110 for configuring the sensor unit 100 may be replaced with at least one substrate configuring the display panel 200 or a thin film encapsulation layer TFE (refer to FIG. 1B).

The first touch electrodes 120 may extend along the first direction, for example, an X direction. According to some embodiments, each of the first touch electrodes 120 located in each row may include a plurality of first sensing cells 122 and first connection portions 124 electrically connecting the first sensing cells 122 of each row along the first direction. According to some embodiments, the first connection portions 124 may be formed integrally with the first sensing cells 122 or may be configured as a connection pattern of a bridge shape. The first touch electrodes 120 may be a driving electrode (Tx electrode) supplied with a touch driving signal for touch driving, and/or a sensing electrode (Rx electrode) outputting a touch sensing signal corresponding to the touch driving signal input to the driving electrode. For example, when the sensor unit 100 is a mutual capacitance method, the first touch electrodes 120 may be implemented as sensing electrodes.

The second touch electrodes 130 may extend along the second direction, for example, a Y direction. According to some embodiments, each of the second touch electrodes 130 located in each column may include a plurality of second sensing cells 132 and second connection portions 134 electrically connecting the second sensing cells 132 of each column along the second direction. According to some embodiments, the second connection portions 134 may be formed integrally with the second sensing cells 132 or may be configured as a connection pattern of a bridge shape. The second touch electrodes 130 may be a driving electrode receiving the touch driving signal for touch driving, and/or a sensing electrode outputting a touch sensing signal corresponding to the touch driving signal input to the driving electrode. For example, when the sensor unit 100 is a mutual capacitance method, the first touch electrodes 120 may be sensing electrodes, and the second touch electrodes 130 may be driving electrodes.

The lines 140 connect each of the first touch electrodes 120 and the second touch electrodes 130 to the pad unit 150. For example, each line 140 may electrically connect the corresponding first touch electrode 120 or second touch electrode 130 to a pad (e.g., a set or predetermined pad) 152 provided in the pad unit 150.

The pad unit 150 may include a plurality of pads 152 for connecting the first and second electrodes 120 and 130 to an external driving circuit, for example, the touch driver 300. Signal transmission and/or power supply may be performed between the sensor unit 100 and the touch driver 300 through the pad unit 150.

Referring to FIGS. 1A and 1B again, the display panel 200 may include a base substrate BSL, an element layer DSL located on the base substrate BSL, and the thin film encapsulation layer TFE located on the element layer DSL.

The base substrate BSL is a substrate supporting the element layer DSL. In some embodiments, the base substrate BSL may be formed of an insulating material such as glass, quartz, or polymer resin. An example, of the polymer material may include polyethersulphone (PES), polyacrylate (PA), polyarylate (PAR), polyetherimide (PEI), polyethylene napthalate (PEN), polyethylene terephtalate (PET), polyphenylene sulfide (PPS), polyallylate, polyimide (PI), polycarbonate (PC), cellulose triacetate (CAT), cellulose acetate propionate (CAP), or a combination thereof. The base substrate BSL may include a metal material.

The base substrate BSL may be a rigid substrate or a flexible substrate capable of bending, folding, rolling, or the like. An example of a material configuring the flexible substrate may include polyimide (PI), but embodiments according to the present disclosure are not limited to.

The element layer DSL may be located on the base substrate BSL. In some embodiments, the element layer DSL may include a plurality of pixels PX and a plurality of display signal lines located on the base substrate BSL. Each pixel PX may include a thin film transistor (TFT), a capacitor, and a light emitting element. The plurality of display signal lines may include a plurality of scan lines 210 transmitting a scan signal to each pixel PX and data lines 220 transmitting a data signal. The pixels PX included in the element layer DSL may be positioned in the display area 201.

The element layer DSL may further include elements and lines located on the base substrate BSL and positioned in the display area 201. In addition, the elements and the lines may generate various signals applied to the pixels PX or transmit the corresponding signals to the pixels PX.

The thin film encapsulation layer TFE may be positioned on the element layer DSL. The thin film encapsulation layer TFE may protect the element layer DSL. The thin film encapsulation layer TFE may include a plurality of thin films.

A cover window CW may be arranged on the sensor unit 100. The cover window CW is located on the display panel 200 and protects the display panel 200 from an external impact or the like. The cover window CW may be implemented with a transparent material, for example, a film formed of tempered glass or plastic material.

According to some embodiments, the display device 1000 may further include an optical member.

As shown in FIG. 1A, in the display area 201 according to some embodiments, a plurality of scan lines 210 and data lines 220, and a plurality of pixels PX connected to the scan lines 210 and data lines 220 are provided. Lines for supplying various driving signals and/or power for driving the pixels PX may be provided in the non-display area 202.

In the disclosure, a type of the display panel 200 is not particularly limited. For example, the display panel 200 may be a self-luminous display panel. In this case, the display panel 200 may include a plurality of light emitting elements. For example, the light emitting element may be selected as an organic light emitting diode. In addition, the light emitting element may be selected as an inorganic light emitting diode such as a micro light emitting diode (LED) or a quantum dot light emitting diode. In addition, the light emitting element may be an element configured of an organic material and an inorganic material complexly.

Alternatively, the display panel 200 may be a non-emission display panel such as a liquid crystal display panel (LCD panel), an electrophoretic display panel (EPD panel), and an electro-wetting display panel (EWD panel). When the display panel 200 is a non-emission display panel, the display device 1000 may further include a backlight unit for supplying light to the display panel 200.

The touch driver 300 may be electrically connected to the sensor unit 100 and transmit/receive a signal necessary for driving the sensor unit 100. For example, after supplying the touch driving signal to the sensor unit 100, the touch driver 300 may receive the touch sensing signal corresponding to the touch driving signal from the sensor unit 100 to detect the touch input.

An application processor AP may supply information on an application executed on the display device 1000 and/or a user interface displayed on the display area 201 to the touch driver 300, analyze touch point coordinate information CRI (refer to FIG. 6) input from the touch driver 300, and perform an instruction corresponding to a user's touch operation.

The display driver 400 may be electrically connected to the display panel 200 and supply a signal necessary for driving the display panel 200. According to some embodiments, as shown in FIG. 3, the display driver 400 may include a scan driver SDR that supplies scan signals S1, S2, . . . , and Sn to the scan lines 210, a data driver DDR that supplies data signals D1, D2, . . . , and Dm to the data lines 220, and a timing controller TCON that receives various control signals Vsync, Hsync, and CLK for driving the scan driver SDR and the data driver DDR and/or image data DATA from the application processor AP.

The scan driver SDR may connected to the scan lines 210, generate the scan signals S1, S2, . . . , and Sn in response to a scan control signal SCS of the timing controller TCON, and output the generated scan signals S1, S2, . . . , and Sn to the scan lines 210. According to some embodiments, the scan driver SDR may include a plurality of stage circuits, and may sequentially supply the scan signals S1, S2, . . . , and Sn to the scan lines 210.

The data driver DDR is connected to the data lines 220, generates the data signals D1, D2, . . . , and Dm in response to a data control signal DCS of the timing controller TCON, and outputs the generated data signal D1, D2, . . . , and Dm to the data lines 220. At this time, the data driver DDR may convert the digital image data DATA provided from the timing controller TCON into analog data signals (or voltages) D1, D2, . . . , and Dm. The data driver DDR generating the data signals D1, D2, . . . , and Dm may supply the data signals D1, D2, . . . , and Dm to the data lines 220 so as to be synchronized with the scan signal (any one of S1 to Sn).

The timing controller TCON may receive the image data DATA and synchronization signals Vsync and Hsync and a clock signal CLK for controlling display of the image data DATA from the application processor AP. The timing controller TCON may correct the input image data DATA to be suitable for image display of the display panel 200, and output the corrected image data DATA to the data driver DDR. In addition, the timing controller TCON may generate driving control signals SCS and DCS for controlling driving of the scan driver SDR and the data driver DDR based on the synchronization signals Vsync and Hsync and the clock signal CLK.

The pixels PX are selected in horizontal line unit in response to the scan signals S1, S2, . . . , and Sn supplied to any one of the scan lines 210. At this time, each of the pixels PX selected by the scan signals S1, S2, . . . , and Sn may receive the data signal (any one of D1 to Dm) from the data lines 220 connected thereto. Each of the pixels PX supplied with the data signal may generate light of a luminance (e.g., a set or predetermined luminance) in response to the data signals D1, D2, . . . , and Dm.

According to some embodiments, the scan driver SDR, the data driver DDR, and/or the timing controller TCON may be integrated into one, but embodiments according to the present disclosure are not limited thereto. In addition, according to some embodiments, at least one of the scan driver SDR, the data driver DDR, or the timing controller TCON may be integrated or mounted on the display panel 200.

Referring to FIGS. 4A and 4B, each pixel PX may include an emission area EMA and a non-emission area NEM. That is, emission area EMA may overlap a light emitting element LD in a third direction (or a Z-axis direction) that is a thickness direction, and the non-emission area NEM may not overlap the light emitting element LD in the third direction (or Z-axis direction).

The pixel PX may include a first color pixel, a second color pixel, and a third color pixel. Each pixel PX may be arranged in various methods. According to some embodiments, the first color pixel (for example, a red pixel) and the second color pixel (for example, a blue pixel) may be alternately arranged in a first row along the first direction (X-axis direction), and the third color pixel (for example, a green pixel) may be arranged along the first direction (X-axis direction) in a second row adjacent to the first row. The pixel belonging to the second row may be alternately arranged in the first direction (X-axis direction) with respect to the pixel belonging to the first row. The number of third color pixels belonging to the second row may be twice the number of first color pixels or second color pixels belonging to the first row. The arrangement of the first row and the second row may be repeated along the second direction (Y-axis direction).

Sizes of the emission area EMA in each pixel PX may be different. For example, an emission area EMA_B of the second color pixel may be greater than an emission area EMA_R of the first color pixel, and an emission area EMA_G of the third color pixel may be less than the emission area EMA_R of the first color pixel.

A shape of the emission area EMA of each pixel PX may be substantially octagonal. However, embodiments according to the present disclosure are not limited thereto, and the shape of each emission area EMA may be a circle, a rhombus, other polygons, a polygon of which a corner is rounded, or the like.

The first touch electrode 120 (or the touch electrode TE) may be divided into a mesh hole MH and a body portion BP. The mesh hole MH may overlap the emission area EMA in the thickness direction, and the area of the mesh hole MH may be greater than the area of the emission area EMA. The body portion BP may overlap the non-emission area NEM in the thickness direction, and a width of the body portion BP may be less than a width of the non-emission area NEM. Through such a structure, light output from the emission area EMA of the display panel 200 may effectively pass through the first touch electrode 120.

As shown in FIG. 4B, a first electrode EU is arranged for each pixel PX on the base substrate BSL. A pixel defining layer PDL exposing the first electrode EU may be located on the first electrode EL1. The pixel defining layer PDL is located in the non-emission area NEM.

An emission layer EML may be arranged on the first electrode EL1 exposed by the pixel defining layer PDL, and a second electrode EL2 may be arranged on the emission layer EML. The second electrode EL2 may be entirely arranged without distinguishing the pixel. The first electrode EL1, the emission layer EML, and the second electrode EL2 configure the light emitting element LD.

The thin film encapsulation layer TFE including a first inorganic layer IOL1, an organic layer OL, and a second inorganic layer IOL2 may be arranged on the second electrode EL2, and a first insulating layer IL1, the touch electrodes 120, and the second insulating layer IL2 may be sequentially arranged on the thin film encapsulation layer TFE. The first inorganic layer IOL1 and the second inorganic layer IOL2 may protect the element layer DSL from moisture/oxygen, and the organic layer OL may protect the element layer DSL from a foreign substance such as a dust particle.

The body portion BP may overlap the pixel defining layer PDL and may be positioned in the non-emission area NEM. That is, because the body portion BP does not overlap the emission area EMA, the body portion BP may not interfere with light emission.

Figure 5:
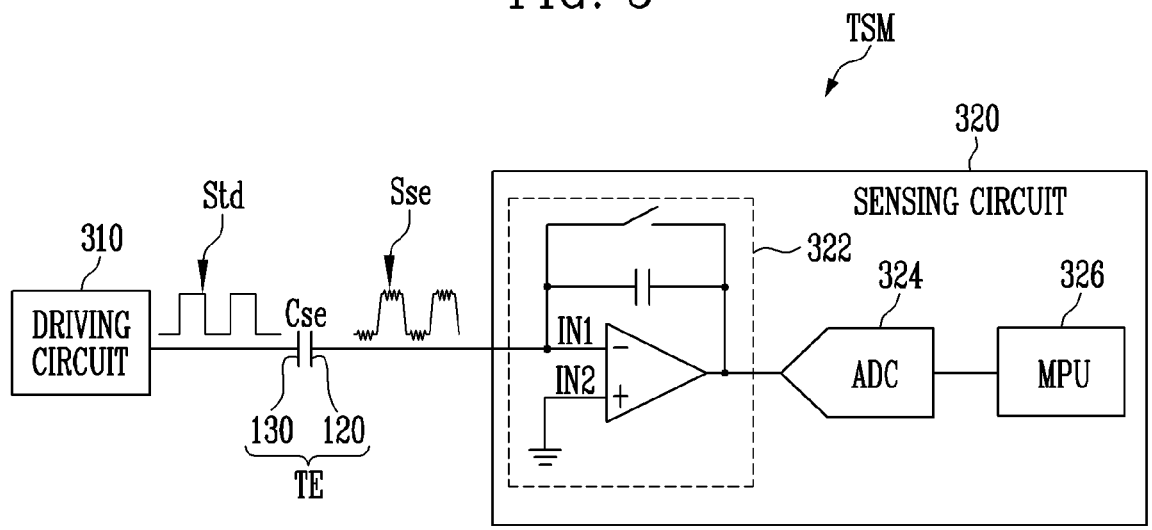
FIG. 5 is a diagram illustrating a method of driving a touch sensor according to some embodiments of the present disclosure.

FIG. 5 is a diagram illustrating a method of driving a touch sensor according to some embodiments of the present disclosure. For convenience, in FIG. 5, the capacitance Cse formed at the intersection of each of the first touch electrode 120 and the second touch electrode 130 is equivalently shown, and a method of detecting the touch input using the capacitance Cse is described.

Referring to FIG. 5, the capacitance Cse is formed at the intersection of the first touch electrode 120 and the second touch electrode 130. The second touch electrode 130 receives a touch driving signal Std from a driving circuit 310 provided in the touch driver 300. Then, a touch sensing signal Sse corresponding to the touch driving signal Std is output from the first touch electrode 120 by a coupling action of the capacitance Cse. The touch sensing signal Sse is input to a sensing circuit 320 provided in the touch driver 300. The sensing circuit 320 amplifies, converts and signal-processes the touch sensing signal Sse input from each of the first touch electrodes 120, and detects the touch input according to a result of the amplification, conversion, and signal-processing.

According to some embodiments, the sensing circuit 320 may include a signal receiver 322, an analog-to-digital converter (hereinafter abbreviated as 'ADC') 324, and a signal processor 326.

The signal receiver 322 receives the touch sensing signal Sse from each of the first touch electrodes 120. The signal receiver 322 may amplify and output the touch sensing signal Sse. For example, the signal receiver 322 may be implemented as an analog front end (hereinafter abbreviated as 'AFE') including at least an operational amplifier. According to some embodiments, a first input terminal IN1 of the signal receiver 322, for example, an inverted input terminal of the operational amplifier may be electrically connected to each of the first touch electrodes 120. That is, the touch sensing signal Sse from the first touch electrode 120 may be input to the first input terminal IN1. Meanwhile, a second input terminal IN2 of the signal receiver 322, for example, a non-inverting input terminal of the operational amplifier may be electrically connected to a ground (hereinafter, abbreviated as 'GND') terminal. That is, a GND voltage may be input to the second input terminal IN2.

The ADC 324 converts an analog signal input from the signal receiver 322 into a digital signal. According to some embodiments, the ADC 324 may be provided as many as the number of the first touch electrodes 120 to correspond 1:1 to each sensing channel corresponding to each of the first touch electrodes 120. Alternatively, according to some embodiments, the ADC 324 may be configured so that a plurality of first touch electrodes 120 share one ADC 324. In this case, a switching circuit may be additionally provided between the signal receiver 322 and the ADC 324.

The signal processor 326 signal-processes the conversion signal (digital signal) from the ADC 324 and detects the touch input according to a signal processing result. For example, the signal processor 326 may synthetically analyze a signal (amplified and converted touch sensing signal Sse) input from the plurality of first touch electrodes 120 through the signal receiver 322 and the ADC 324, and detect whether or not touch input is generated and a position of the touch input. According to some embodiments, the signal processor 326 may be implemented as a microprocessor (hereinafter abbreviated as 'MPU'). In this case, a memory necessary for driving the signal processor 326 may be additionally provided inside the sensing circuit 320. Meanwhile, a configuration of the signal processor 326 is not limited thereto. As another example, the signal processor 326 may be implemented as a microcontroller (MCU) or the like.

The touch sensor TSM as described above may be coupled to the display panel 200 and the like. For example, the sensor unit 100 may be manufactured integrally with the display panel 200 or may be manufactured separately from the display panel 200 and then attached to at least one surface side of the display panel 200.

As described above, when the sensor unit 100 is coupled to the display panel 200, a parasitic capacitance may be generated between the sensor unit 100 and the display panel 200. Noise from the display panel 200 may be transmitted to the touch sensor TSM, in particular, the sensor unit 100 due to a coupling action or the like of the parasitic capacitance.

The noise introduced into the touch sensor TSM causes a ripple of the touch sensing signal Sse, and thus a jitter phenomenon in which a touch point is randomly detected in a touch area may occur.

The signal processor 326 may include a jitter removal unit 326*c* (refer to FIG. 6) for improving the jitter phenomenon. The jitter removal unit 326*c* is described in more detail later with reference to FIGS. 6 to 9.

Figure 6:
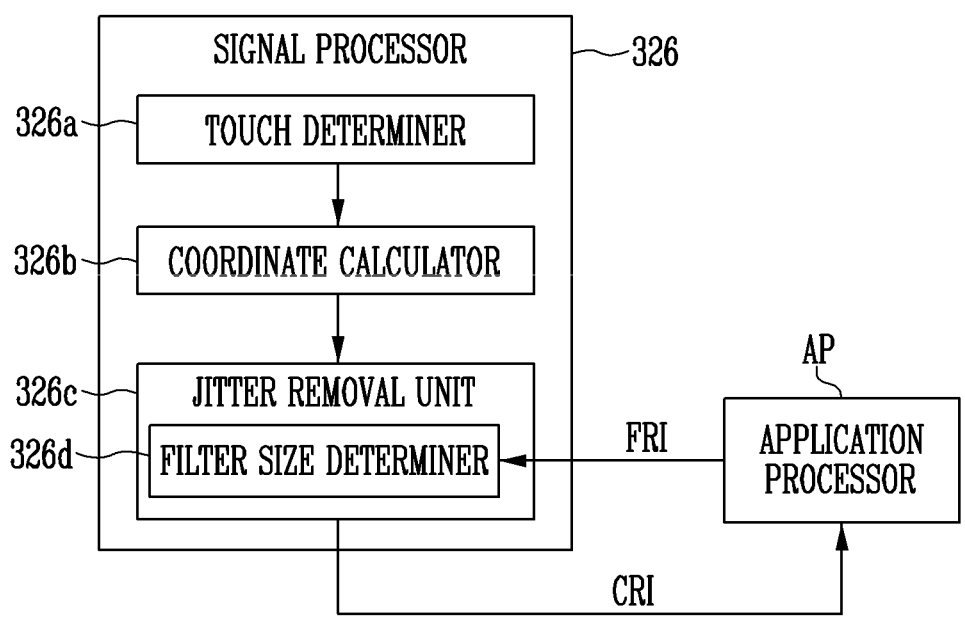
FIG. 6 is a block diagram illustrating a signal processor shown in FIG. 5 according to some embodiments of the present disclosure.
Figure 7A:
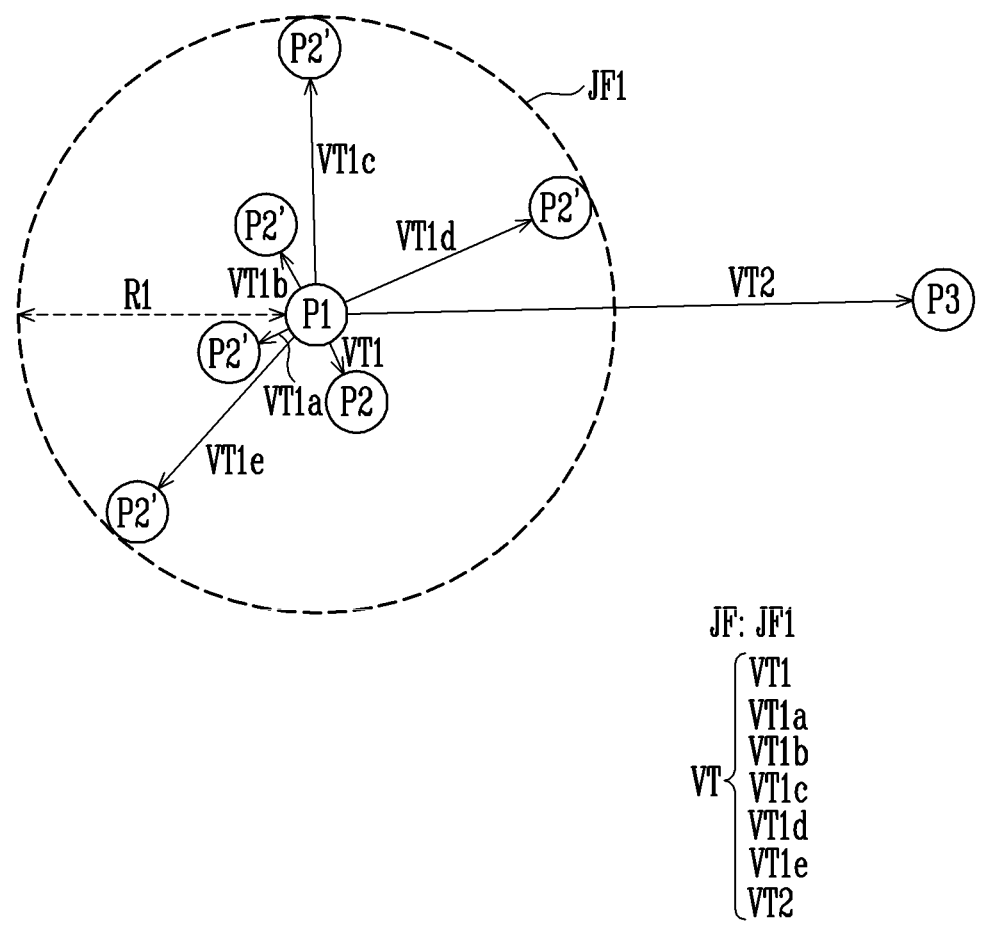
FIGS. 7A and 7B are diagrams illustrating a case in which a range of a jitter filter is set to be relatively wide according to some embodiments of the present disclosure.
Figure 7B:
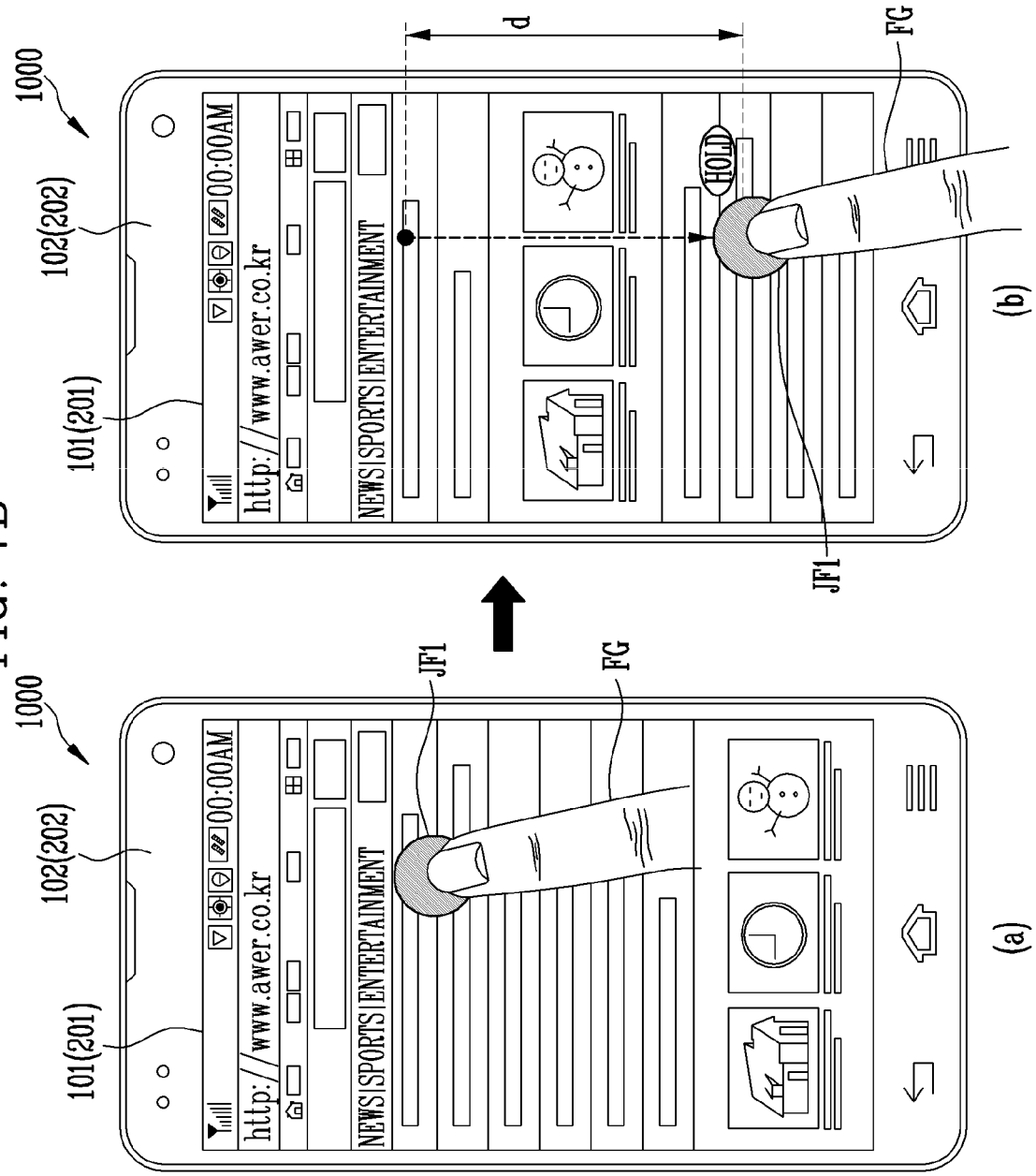
Figure 8A:
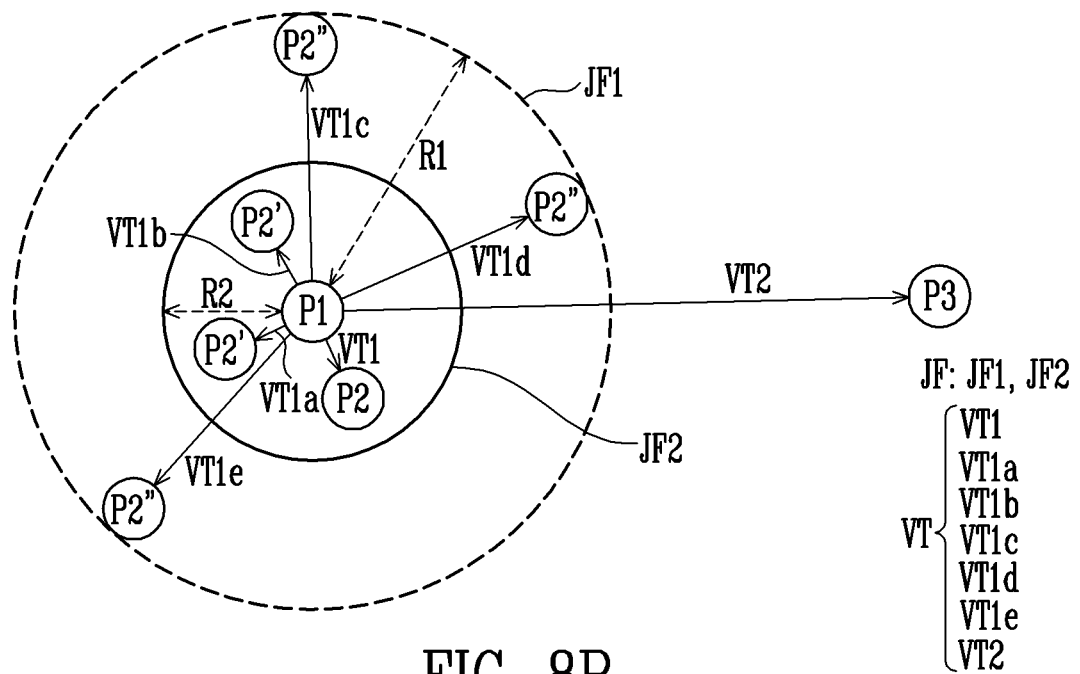
FIGS. 8A and 8B are diagrams illustrating a case in which the range of the jitter filter is set to be relatively narrow according to some embodiments of the present disclosure.
Figure 8B:
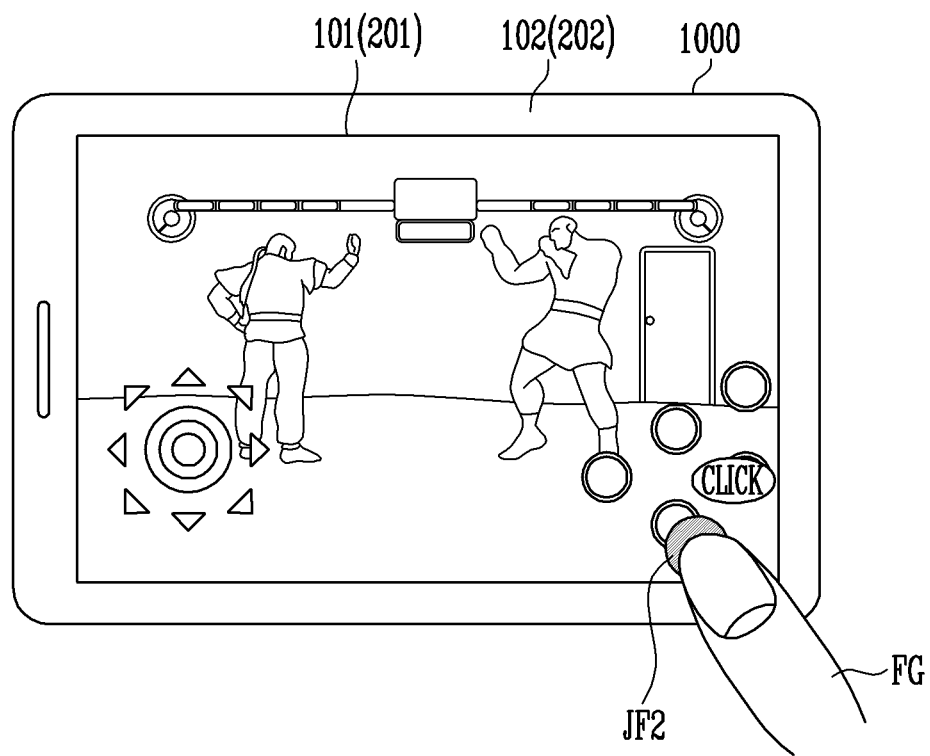

FIG. 6 is a block diagram illustrating embodiments of the signal processor shown in FIG. 5. FIGS. 7A and 7B are diagrams illustrating a case in which a range of a jitter filter is set to be relatively wide. FIGS. 8A and 8B are diagrams illustrating a case in which the range of the jitter filter is set to be relatively narrow.

Referring to FIGS. 5 and 6, the signal processor 326 may detect the touch area by determining whether or not a touch is generated for each intersection (hereinafter, a touch pixel) between the first touch electrodes 120 and the second touch electrodes 130 shown in FIG. 1A using the touch sensing signal Sse, and may supply touch point coordinate information CRI on the detected touch area to the application processor AP. To this end, the signal processor 326 may include a touch determiner 326*a*, a coordinate calculator 326*b*, and a jitter removal unit 326*c*. The jitter removal unit 326*c* may further include a filter size determiner 326*d* that varies a size of the jitter filter in response to filter size information FRI received from the application processor AP.

The touch determiner 326*a* may detect the touch area by determining whether or not the touch is generated for each touch pixel using the touch sensing signal Sse from the sensor unit 100. The touch determiner 326*a* may compare the touch sensing signal Sse of a current frame from the sensor unit 100 with a reference frame, and generate a binary data frame indicating whether or not the touch exists for each touch pixel. The touch determiner 326*a* may group data of adjacent touch pixels where the touch exists into the touch area, and detect each touch area.

The coordinate calculator 326*b* may calculate and output a touch point coordinate representing each touch area in each touch area detected by the touch determiner 326*a*. The coordinate calculator 326*b* may find a peak value position of the touch sensing signal Sse in each touch area, and detect and output the peak value position as the touch point coordinate.

The jitter removal unit 326*c* may filter the currently detected touch point coordinate from the coordinate calculator 326*b* to determine and output a final touch point coordinate from which a jitter component is removed.

In order to vary the range of the jitter filter for each situation, the jitter removal unit 326*c* may include a filter size determiner 326*d*. The filter size determiner 326*d* may receive the filter size information FRI from the application processor AP and change the size of the jitter filter JF in response to the filter size information FRI. At this time, the filter size information FRI may include information on the application executed on the display device 1000 (refer to FIG. 1) and/or information on the user interface.

Referring to FIGS. 7A to 8B, the range of the jitter filter JF according to some embodiments may have a first size (for example, a first radius R1) when the user interface performs the same function on a touch input within a first range (for example, an inner area of a circle having the first radius R1), and may have a second size (for example, a second radius R2) less than the first size when the user interface performs the same function on a touch input within a second range (for example, an inner area of a circle having the second radius R2) narrower than the first range.

When filtering the detected touch point coordinate, advantages and disadvantages may be different according to the size (or the range) of the jitter filter JF used for filtering. For example, as shown in FIG. 7A, when the range of the jitter filter JF is set to be relatively wide, stability of the filtered touch point coordinate may be excellent, but a touch point coordinate response may be relatively slow. Conversely, as shown in FIG. 8A, when the range of the jitter filter JF is set to be relatively narrow, the touch point coordinate response may be relatively fast, but the stability of the filtered touch point coordinate may be low. That is, the stability of the touch point coordinate and a touch point coordinate response speed may be in a trade-off relationship.

Referring to FIG. 7A, the jitter removal unit 326c may determine whether or not a jitter exists in a touch fix state and a touch movement state according to a size and a direction of a motion vector VT of the currently detected touch point coordinates P2 and P3. When it is determined as the jitter in the touch fix state, the jitter removal unit 326c may remove the jitter component by determining and outputting a previous touch point coordinate P1 as a final coordinate instead of the currently detected touch point coordinate P2. When it is determined that it is not jitter or it is determined as the touch movement state, the currently detected touch point coordinate P3 may be determined and output as the final coordinate.

For example, the jitter removal unit 326c may determine the touch fix state in which the touch area is fixed, such as a click, and the touch movement state, in which the touch area moves by a range (e.g., a set or predetermined range) or more, such as dragging.

The jitter removal unit 326c may set a first jitter filter JF1 based on the previous touch point coordinate P1, and may detect the motion vectors VT using the currently detected touch point coordinate P2 or P3 and the previous touch point coordinate P1. At this time, a shape of the first jitter filter JF1 may be set as a circular shape. For example, the first jitter filter JF1 may be set as a circular shape having the first radius R1 of a size of 2.2 mm. However, the shape and size of the jitter filter JF1 are not limited thereto, and may be preset to have a range (e.g., a set or predetermined range) by a designer in various shapes such as ellipse or a quadrangle.

The jitter removal unit 326c may determine whether or not the jitter exists in the touch fix state and the touch movement state according to the size and the direction of the motion vector VT. The jitter removal unit 326c may compare the size of the currently detected motion vector VT with the range of the jitter filter JF1 to determine whether or not the currently detected touch point coordinate P2 or P3 is positioned within the range of the jitter filter JF1. In addition, the jitter removal unit 326c may compare the direction of the motion vector VT during a frame (e.g., a set or predetermined frame) (for example, 3 frames) to determine whether or not the direction of the motion vector VT is the same during the frame (e.g., the set or predetermined frame). Therefore, the jitter removal unit 326c may determine the final coordinate by determining whether or not the jitter exists in the touch fix state and touch movement state.

For example, the user may actually touch the currently detected touch point coordinate P2 spaced apart by the direction and the size of a first motion vector VT1 from the previous touch point coordinate P1. Thereafter, even though the user does not actually change the touch point to another position, a plurality of currently detected touch point coordinates P2' may be additionally generated regardless of a user's intention due to external noise (or jitter).

When a total of six currently detected touch point coordinate P2 and P2' are generated within a range of a first jitter filter JF1 (for example, the circle having the first radius R1) during a frame (e.g., a set or predetermined frame), and each of the currently detected touch point coordinates P2 and P2' has a plurality of first motion vectors VT1, VT1a, VT1b, VT1c, VT1d, and VT1e having different directions based on the previous touch point coordinate P1, the jitter removal unit 326c may determine the currently detected touch point coordinates P2 and P2' as the jitter component in the touch fix state, and determine and output the previous touch point coordinate P1 instead of the currently detected touch point coordinate P2 as the final coordinate.

Meanwhile, when the currently detected touch point coordinate P3 move by a range (e.g., a set or predetermined range) or more of the jitter filter JF1 and the direction of the second motion vector VT2 is the same during a frame (e.g., a set or predetermined frame), the jitter removal unit 326c may determine the touch movement state, and determine and output the currently detected touch point coordinate P3 as the final coordinate. The jitter removal unit 326c may determine and output the final coordinate without determining whether or not the jitter exits with respect to the currently detected touch point coordinate when a previous frame is in the touch movement state. Therefore, reduction of a touch sensing speed due to determination whether or not the jitter exists in the touch movement state may be prevented.

As described above, as the range of the jitter filter JF increases, the jitter removal unit 326c may calculate the motion vector VT for touch points generated in a wider area to determine whether or not the jitter corresponds. Therefore, stability of the filtered touch point coordinate may be excellent.

Referring to FIG. 7B, an application and a user interface that may be set to a relatively wide size like the first jitter filter JF1 of FIG. 7A is described.

The application executed on the display device 1000 may be an Internet browser. The Internet browser according to some embodiments may provide a function of automatically scrolling a searched screen for user convenience when the user touches one point of the display area 201 as shown in FIG. 7b(a) using a finger FG, drags a distance (e.g., a set or predetermined distance) d as shown in FIG. 7b(b), and then holds. In this case, because the purpose of the use is to automatically scroll the screen by holding the finger FG at the point where the dragging is finished, a scroll function may be performed on both of the currently detected touch point coordinates P2 and P2' within the first radius R1. Conversely, when it is assumed that a second jitter filter JF2 having the second radius R2 less than the first radius R1 is applied as shown in FIG. 8A, because currently detected touch point coordinates P2" belonging to a range between the first radius R1 and the second radius R2 are not considered as the jitter, the currently detected touch point coordinates P2" may be recognized as a signal inputting an instruction to move the screen in a different direction. That is, an automatic scrolling state may be ended or a buffering phenomenon in which a screen switching is not smooth may be caused.

Referring to FIG. 8A, when a total of three currently detected touch point coordinate P2 and P2' are generated within the range (for example, the circle having the second radius R2) of the second jitter filter JF2 during a frame (e.g., a set or predetermined frame), and each of the currently detected touch point coordinates P2 and P2' has a plurality of first motion vectors VT1, VT1a, and VT1b of which directions are different based on the previous touch point coordinate P1, the jitter removal unit 326c may determine the currently detected touch point coordinates P2 and P2' as the jitter component in the touch fix state, and determine and output the previous touch point coordinate P1 instead of the currently detected touch point coordinates P2 and P2' as the final coordinate.

At this time, a shape of the second jitter filter JF2 may be set as a circular shape. For example, the second jitter filter JF2 may be set as a circular shape having the second radius R2 of 1 mm. The currently detected touch point coordinate P2" belonging to the range between the first radius R1 and the second radius R2 may not be regarded as the jitter.

Meanwhile, when the currently detected touch point coordinate P3 moves by a range (e.g., a set or predetermined range) or more of the jitter filter JF1 and a direction of a second motion vector VT2 is the same during a frame (e.g., a set or predetermined frame), the jitter removal unit 326c may determine as the touch movement state, and may determine and output the currently detected touch point coordinate P3 as the final coordinate. The jitter removal unit 326c may determine and output the final coordinate without determining whether or not the jitter exits with respect to the currently detected touch point coordinate when a previous frame is in the touch movement state. Therefore, reduction of a touch sensing speed due to determination whether or not the jitter exists in the touch movement state may be prevented.

As described above, as the range of the jitter filter JF decreases, the jitter removal unit 326c only needs to calculate the motion vector VT for touch points detected less and determine whether or not the jitter corresponds. Therefore, touch point coordinate response speed may increase.

Referring to FIG. 8B, an application and a user interface may be set to a relatively narrow size like the second jitter filter JF2 of FIG. 8A is described.

An application executed on the display device 1000 may be a game. The game according to some embodiments may display a virtual direction key and operation key for controlling a character implemented in the game on the screen.

In particular, the operation key is a virtual button for instructing a specific operation (for example, punch, kick, or the like) of the character, and the user may repeatedly click the operation key during a short time. In this case, since the purpose of the user is to quickly press the virtual button displayed on a specific area, filtering may be performed only for the currently detected touch point coordinate P2 and P2' included within the relatively narrow second radius R2 to increase the touch point coordinate response speed.

Conversely, when it is assumed that the first jitter filter JF1 having the first radius R1 greater than the second radius R2 is applied as shown in FIG. 7A, the motion vector VT may also be calculated with respect to the currently detected touch point coordinate P2" belonging to the range between the first radius R1 and the second radius R2, and thus the touch point coordinate response speed may be reduced. That is, an instruction input by the user may be omitted, and thus the user may not be able to manipulate the character as intended.

In addition, in a case of a first touch, the jitter removal unit 326c may determine and output the currently detected touch point coordinate as the final coordinate.

The filter size determiner 326d according to some embodiments receives the filter size information FRI including the information on the application executed on the display device 1000 (refer to FIG. 1) and/or the information of the user interface from the application processor AP.

Therefore, the filter size determiner 326d may vary the range of the jitter filter for each situation. Therefore, optimized stability of the touch point coordinate and touch point coordinate response speed may be implemented by reflecting an intention of a provider providing the application and/or the user interface.

FIG. 9 is a flowchart illustrating a jitter removal method in the touch sensing method according to some embodiments of the present disclosure. The jitter removal method is performed by the jitter removal unit 326c of the signal processor 326 shown in FIG. 6. Embodiments according to the present disclosure are not limited to the operations illustrated in FIG. 9. For example, some embodiments according to the present disclosure may include additional operations or fewer operations without departing from the spirit and scope of embodiments according to the present disclosure.

Referring to FIGS. 6 to 9, the filter size determiner 326d of the jitter removal unit 326c may receive the filter size information FRI from the application processor AP (S10). At this time, the filter size information FRI may include the information on the application executed on the display device 1000 (refer to FIG. 1) and/or the information on the user interface.

The filter size determiner 326d may determine whether or not to change the size of the jitter filter JF (S20). According to some embodiments, the signal processor 326 may set the first jitter filter JF1 having the first radius R1 as a default. For example, the first radius R1 may be 2.2 mm. However, this is an example, and the size (or the range) of the jitter filter JF may be variously set according to the type of the application executed on the display device 1000 and/or the user interface. That is, the signal processor 326 may set the second jitter filter JF2 having the second radius R2 as a default. For example, the second radius R2 may be 1 mm.

The filter size determiner 326d may reset the size of the jitter filter JF to a preset size in response to the filter size information FRI (S30).

As a result of reading the information of the application and/or the information of the user interface provided from the application processor AP, when the second radius R2 less than the first radius R1 is required, the filter size determiner 326d may change to the second jitter filter JF2. For convenience of description, only two types of filter sizes (for example, the first radius R1 and the second radius R2) are described in FIGS. 6 to 9. However, the filter size may be variously set in response to the information of the application and/or the information of the user interface.

As the range of the jitter filter JF increases, the jitter removal unit 326c may calculate the motion vector VT for the touch points generated in a wider area to determine whether or not the jitter corresponds, and thus the stability of the filtered touch point coordinate may be excellent. Meanwhile, as the range of the jitter filter JF decreases, the jitter removal unit 326c only needs to calculate the motion vector VT for the touch points detected less to determine whether or not the jitter corresponds, and thus the touch point coordinate response speed may be increased.

The jitter removal unit 326c may determine whether or not the currently detected touch point coordinate is an initial touch without a previous touch. When the currently detected touch point coordinate is the initial touch, the jitter removal unit 326c may proceed to operation S50, and when the currently detected touch point coordinate is not the initial touch, the jitter removal unit 326c may proceed to operation S60 (S40).

When the currently detected touch point coordinate is the initial touch, the currently detected touch point coordinate may be determined as the final coordinate (S50).

When the currently detected touch point coordinate is not the initial touch, the jitter removal unit 326c determines whether or not the touch state is fixed. When the currently detected touch point coordinate is not the initial touch and the touch state of the previous frame is set to fix, it may be determined as the touch fix state and proceed to the next operation S60.

On the other hand, when the currently detected touch point coordinate is not the initial touch and the touch state of the previous frame is set to move, it may be determined that the touch movement state continues and proceed to the next operation S80. Thus, in operation S80, the currently detected touch point coordinate may be determined as the final coordinates without determining whether or not the jitter exists, and in operation S90, the determined final coordinate may be output.

When the touch state is fixed in operation S60, the jitter removal unit 326c may determine whether or not the jitter exists in the touch fix state and the touch movement state according to the size and the direction of the motion vector VT (S70).

The jitter removal unit 326c may apply the size of the jitter filter JF1 or JF2 determined in S20 and S30 based on the previous touch point coordinate P1 as shown in FIGS. 7A and 7B, and may detect the motion vector VT using the currently detected touch point coordinate P2 or P3 and the previous touch point coordinate P1. The jitter removal unit 326c may compare the size of the currently detected motion vector VT with the size of the jitter filter JF1 or JF2 to determine the currently detected touch point coordinate P2 or P3 is positioned within the size of the jitter filter JF1 or JF2. In addition, the jitter removal unit 326c may compare the direction of the motion vector VT during a frame (e.g., during a set or predetermined frame) (for example, 3 frames) to determine whether or not the direction of the motion vector VT is the same during the frame (e.g., the set or predetermined frame).

When the currently detected touch point coordinate P2 is positioned within the size of the jitter filter JF1 or JF2 set based on the previous touch point coordinate P1 and the direction of the motion vector VT is different from the direction of the motion vector VT of the previous frame, the jitter removal unit 326c may determine the currently detected touch point coordinate P2 as the jitter component of the touch fix state, and proceed to operation S90 to output the previous touch point coordinate P1 instead of the currently detected touch point coordinate P2 as the final coordinate.

On the other hand, when the currently detected touch point coordinate P3 moves by a range (e.g., a set or predetermined range) or more of the jitter filter JF1 or JF2 size and the direction of the motion vector VT is the same during the frame (e.g., the set or predetermined frame), the jitter removal unit 326c may determine as the touch movement state, proceed to operation S80 to determine the currently detected touch point coordinate as the final coordinate, and output the determined final coordinate in operation S90.

As described above, because the display device 1000 (or the filter size determiner 326d) according to some embodiments of the present disclosure may receive the filter size information FRI including the information on the application executed on the display device 1000 (refer to FIG. 1) or the information of the user interface from the application processor AP, the range of the jitter filter may be varied for each situation. Therefore, optimized stability of the touch point coordinate and touch point coordinate response speed may be implemented by reflecting an intention of a provider providing the application and/or the user interface.

Although the above has been described with reference to the embodiments of the disclosure, those skilled in the art will understand that the disclosure may be variously modified and changed within the scope without departing from the spirit and scope of the disclosure described in the claims below, and their equivalents.

What is claimed is:

1. A display device comprising:
   a display panel;
   a sensor unit on the display panel;
   a touch driver including a signal processor configured to output a final touch point coordinate using a touch sensing signal received from the sensor unit; and
   an application processor configured to provide filter size information to the touch driver,
   wherein the signal processor is configured to obtain a current touch point coordinate and to output the final touch point coordinate from which a jitter component is removed by filtering,
   wherein the signal processor is configured to selectively perform filtering on signals associated with an area of the sensor unit around a point of the sensor unit of the current touch point coordinate, and
   wherein the signal processor is configured to vary the area of the filtering in response to the filter size information.

2. The display device according to claim 1, wherein the signal processor is configured to detect touch areas using the touch sensing signal, and
   wherein the signal processor is configured to detect a touch point coordinate representing each of the touch areas.

3. The display device according to claim 2, wherein the filter size information includes the area of the filtering preset for each user interface.

4. The display device according to claim 3, wherein the area of the filtering has a first size in response to the user interface performing a same function on a touch input within a first range, and has a second size less than the first size in response to the user interface performing the same function on a touch input within a second range narrower than the first range.

5. The display device according to claim 1, wherein a shape of the area of the filtering is any one of a circle, an ellipse, and a quadrangle.

6. The display device according to claim 2, wherein the signal processor is configured to calculate a motion vector of the current touch point coordinate based on a previous touch point coordinate.

7. The display device according to claim 6, wherein the signal processor is configured to output the current touch point coordinate as the final touch point coordinate in response to the current touch point coordinate being an initial touch.

8. The display device according to claim 6, wherein in response to a size of the motion vector being less than the area of the filtering and a direction of the motion vector being irregular during a preset frame, the signal processor is configured to determine the current touch point coordinate as the jitter component of a touch fix state, and to output the previous touch point coordinate as the final touch point coordinate.

9. The display device according to claim 6, wherein in response to a size of the motion vector being greater than the area of the filtering and a direction of the motion vector being constant during a preset frame, the signal processor is configured to determine a touch movement state and to output the current touch point coordinate as the final touch point coordinate.

10. The display device according to claim 9, wherein the signal processor is configured to output the current touch point coordinate as the final touch point coordinate without determining the jitter component in response to a previous touch state being the touch movement state.

11. The display device according to claim 1, wherein in the display panel, a base substrate, an element layer, and a thin film encapsulation layer are sequentially stacked, and the sensor unit is formed on the thin film encapsulation layer.

12. A touch sensing method in a display device comprising a display panel that displays an execution screen of an application and a sensor unit on the display panel, the method comprising:
receiving a touch sensing signal from the sensor unit;
detecting a first touch point coordinate from the touch sensing signal;
setting an area of the sensor unit associated with signals on which filtering is selectively performed, the area of the sensor unit being around a point of the sensor unit of the first touch point coordinate, the area of the filtering being set according to filter size information received from an application processor;
detecting a second touch point coordinate from the touch sensing signal;
when the second touch point is within the set area of the sensor unit, determining the second touch point to be a jitter component and removing the jitter component by filtering the second touch point coordinate; and
outputting the first touch point coordinate as a final touch point coordinate after removing the jitter component.

13. The touch sensing method according to claim 12, wherein the filter size information includes the area of the filtering preset for each user interface.

14. The touch sensing method according to claim 13, wherein the area of the filtering has a first size in response to the user interface performing the same function on a touch input within a first range, and has a second size less than the first size in response to the user interface performing the same function on a touch input within a second range narrower than the first range.

15. The touch sensing method according to claim 13, wherein a shape of the area of the filtering is any one of a circle, an ellipse, and a quadrangle.

16. The touch sensing method according to claim 12, further comprising calculating a motion vector of the second touch point coordinate based on the first touch point coordinate.

17. The touch sensing method according to claim 16, further comprising, when the second touch point coordinate is outside the set area of the sensor unit, outputting the second touch point coordinate as the final touch point coordinate.

18. The touch sensing method according to claim 16, further comprising, when a magnitude of the motion vector is less than the area of the filtering and a direction of the motion vector is irregular during a frame, determining the second touch point coordinate as the jitter component of a touch fix state and outputting the first touch point coordinate as the final touch point coordinate.

19. The touch sensing method according to claim 16, further comprising, when a magnitude of the motion vector is greater than the area of the filtering and a direction of the motion vector is constant during a frame, determining the second touch point coordinate as a touch movement state and outputting the second touch point coordinate as the final touch point coordinate.

20. The touch sensing method according to claim 19, further comprising, when the first touch point coordinate is a touch movement state, outputting the second touch point coordinate as the final touch point coordinate without determining the jitter component.

21. The touch sensing method according to claim 12, wherein in the display panel, a base substrate, an element layer, and a thin film encapsulation layer are sequentially stacked, and the sensor unit is formed on the thin film encapsulation layer.

* * * * *